(12) United States Patent
Ishimasa (10) Patent No.: US 9,400,369 B2
(45) Date of Patent: Jul. 26, 2016

(54) OPTICAL APPARATUS

(71) Applicant: CANON KABUSHIKI KAISHA, Tokyo (JP)

(72) Inventor: Toru Ishimasa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 53 days.

(21) Appl. No.: 14/566,913

(22) Filed: Dec. 11, 2014

(65) Prior Publication Data
US 2015/0168669 A1 Jun. 18, 2015

(30) Foreign Application Priority Data

Dec. 17, 2013 (JP) ................................ 2013-260114

(51) Int. Cl.
| | | |
|---|---|---|
| *G02B 7/02* | (2006.01) | |
| *G03B 21/14* | (2006.01) | |
| *G02B 7/08* | (2006.01) | |
| G02B 7/10 | (2006.01) | |
| G02B 15/14 | (2006.01) | |
| G03F 7/20 | (2006.01) | |

(52) U.S. Cl.
CPC .. *G02B 7/08* (2013.01); *G02B 7/02* (2013.01); *G02B 7/023* (2013.01); *G02B 7/10* (2013.01); *G02B 15/14* (2013.01); *G03F 7/70825* (2013.01)

(58) Field of Classification Search
CPC .......... G02B 7/02; G02B 7/021; G02B 7/022; G02B 7/023; G02B 7/026; G02B 7/08; G02B 7/10; G02B 7/102; G02B 15/14; G02B 21/14; G02B 21/142; H04N 5/2254; H04N 5/2257; G03F 7/70825
USPC .............. 359/811, 819, 823, 738; 396/72–75, 396/144, 350, 526; 353/100, 101
See application file for complete search history.

(56) References Cited

U.S. PATENT DOCUMENTS

| | | | | |
|---|---|---|---|---|
| 6,671,108 B2 * | 12/2003 | Koiwai | ..................... | G02B 7/02 353/100 |
| 6,995,927 B2 | 2/2006 | Onda | | |
| 7,529,046 B2 * | 5/2009 | Schletterer | ............. | G02B 7/022 359/819 |
| 8,717,691 B2 * | 5/2014 | Terahara | .................. | G02B 7/08 348/240.3 |
| 8,743,487 B2 | 6/2014 | Miyoshi | | |
| 8,837,061 B2 | 9/2014 | Ishimasa | | |
| 8,974,129 B2 | 3/2015 | Ishimasa | | |
| 2005/0024741 A1 | 2/2005 | Onda | | |
| 2013/0155530 A1 | 6/2013 | Miyoshi | | |

FOREIGN PATENT DOCUMENTS

| | | |
|---|---|---|
| JP | 2005-049599 A | 2/2005 |
| JP | 2013-125229 A | 6/2013 |

* cited by examiner

*Primary Examiner* — Loha Ben
(74) *Attorney, Agent, or Firm* — Fitzpatrick, Cella, Harper & Scinto (57) ABSTRACT

One holder of the first and second holders in an optical apparatus has first and second adjustment face groups. The first and second adjustment face groups respectively include a plurality of first adjustment faces and a plurality of second adjustment faces. The second adjustment face group is provided along a first rotation direction from the first adjustment face group. The other holder has first and second abutting portions respectively abutting against any one of the plurality of first and second adjustment faces. A position on the optical axis of an adjustment face arranged at an end in a second rotation direction opposite to the first rotation direction among the plurality of first adjustment faces is approximately equal to a position on the optical axis of an adjustment face arranged at an end in the first rotation direction among the plurality of second adjustment faces.

6 Claims, 8 Drawing Sheets

OPTICAL APPARATUS

BACKGROUND OF THE INVENTION

1. Field of the Invention

The invention relates to an optical apparatus including a lens holding mechanism, and the lens holding mechanism is used in an image pickup apparatus such as a digital camera and a digital video camera, an interchangeable lens for a single lens reflex camera and an observation apparatus such as a pair of binoculars, a telescope and a field scope.

2. Description of the Related Art

Recently, miniaturization and high magnification of an optical apparatus such as a camera and a video camera is in process. A diameter of a lens becomes larger so as to achieve high magnification of the optical apparatus. Additionally, position accuracy of a lens is improved so as to satisfy optical performance with miniaturization of the optical apparatus.

Optical performance of the optical apparatus cannot be satisfied even if accuracy of components comprising the optical apparatus and lens performance are improved. Therefore, there is a need to adjust a lens position according to each optical apparatus. For example, decentering adjustment adjusting a lens axis, tilt adjustment adjusting a tilt of the lens axis and tracking adjustment adjusting a distance between lenses are proposed.

Japanese Patent Laid-Open No. 2013-125229 discloses a tracking adjustment method which rotates a lens frame by 180 degrees so as to increase a tracking adjustment range.

Japanese Patent Laid-Open No. 2005-49599 discloses a camera including a lens frame and a movement barrel which holds the lens frame movably along an optical axis. The movement barrel faces to the lens frame and has an annular adjustment face uneven along the optical axis. Additionally, an abutting face abutting against the adjustment face is formed on the lens frame. These configurations perform tracking adjustment which moves the lens frame along the optical axis by rotating the lens frame around the optical axis.

Since the method disclosed in Japanese Patent Laid-Open No. 2013-125229 rotates a lens group, a holding frame needs a range of a receiving surface, and as a result, a space for the tracking adjustment disappears. Moreover, since the method disclosed in Japanese Patent Laid-Open No. 2005-49599 needs a rotational range for adjustment, an adjustment mechanism needs a space.

SUMMARY OF THE INVENTION

The invention provides an optical apparatus which can easily perform tracking adjustment of lenses and has excellent space efficiency.

An optical apparatus as one aspect of the invention has an optical system having a plurality of lenses and is able to adjust a part of lenses along an optical axis, the optical apparatus includes a first holder configured to hold the part of lenses and a second holder configured to hold the first holder, one holder of the first and second holders has a first adjustment face group and a second adjustment face group, the one holder is rotatable relative to the other holder different from the one holder, the first adjustment face group includes a plurality of first adjustment faces of which each position on the optical axis is different, the second adjustment face group includes a plurality of second adjustment faces of which each position on the optical axis is different, the second adjustment face group is provided along a first rotation direction from the first adjustment face group, the other holder has a first abutting portion which abuts against any one of the plurality of first adjustment faces and a second abutting portion which abuts against any one of the plurality of second adjustment faces, and a position on the optical axis of an adjustment face arranged at an end in a second rotation direction opposite to the first rotation direction among the plurality of first adjustment faces is approximately equal to a position on the optical axis of an adjustment face arranged at an end in the first rotation direction among the plurality of second adjustment faces.

An optical apparatus another aspect of the invention has an optical system having a plurality of lenses and is able to adjust a part of lenses along an optical axis, the optical apparatus includes a first holder configured to hold the part of lenses and a second holder configured to hold the first holder, one holder of the first and second holders has a first adjustment face group, a second adjustment face group and a third adjustment face group, the one holder is rotatable relative to the other holder different from the one holder, the first adjustment face group includes a plurality of first adjustment faces of which each position on the optical axis is different, the second adjustment face group includes a plurality of second adjustment faces of which each position on the optical axis is different, the third adjustment face group includes a plurality of third adjustment faces of which each position on the optical axis is different, the second adjustment face group is provided along a first rotation direction from the first adjustment face group, the third adjustment face group is provided along the first rotation direction from the second adjustment face group, the first adjustment face group is provided along the first rotation direction from the third adjustment face group, the other holder has a first abutting portion which abuts against any one the plurality of first adjustment faces, a second abutting portion which abuts against any one of the plurality of second adjustment faces and a third abutting portion which abuts against an adjustment face among the plurality of third adjustment faces, and a position on the optical axis of an adjustment face arranged at an end in a second rotation direction opposite to the first rotation direction among the plurality of first adjustment faces is approximately equal to a position on the optical axis of an adjustment face arranged at an end in the first rotation direction among the plurality of second adjustment faces and a position on the optical axis of an adjustment face not arranged at both ends in the first and second rotation directions among the plurality of third adjustment faces.

DESCRIPTION OF THE EMBODIMENTS

Exemplary embodiments of the invention will be described below with reference to the accompanied drawings. In each of the drawings, the same elements will be denoted by the same reference numerals and the duplicate descriptions thereof will be omitted. Though a digital camera as an example of an optical apparatus of the invention is explained, the invention is not limited to the digital camera.

Figure 1:
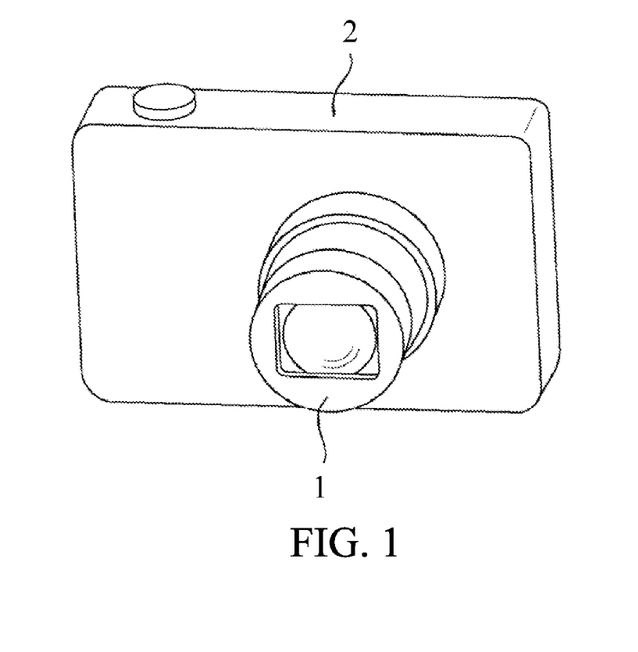
FIG. 1 is a perspective view of a digital camera as an example of an optical apparatus including a lens barrel according to this embodiment of the invention.
Figure 2:
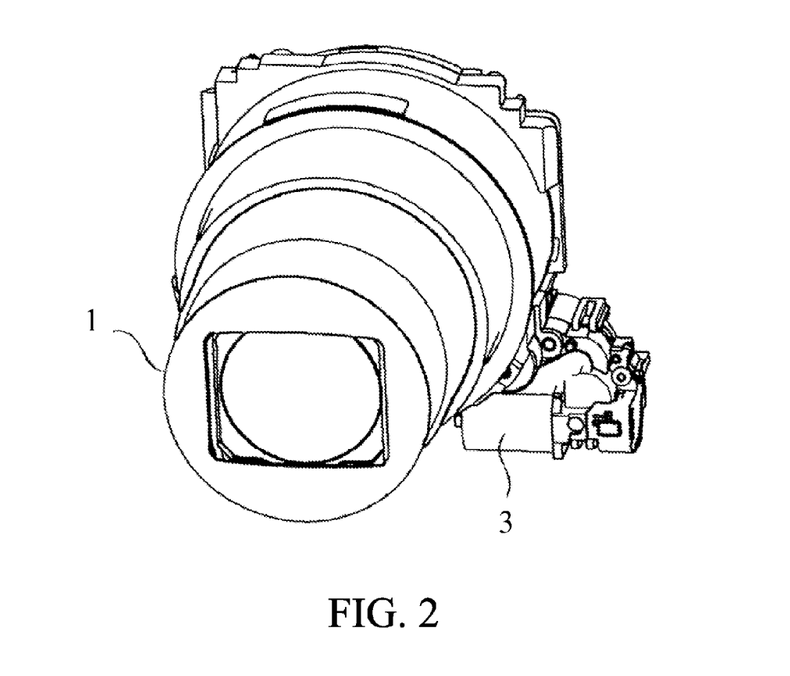
FIG. 2 is a perspective view of the lens barrel.

FIG. 1 is a perspective view of a digital camera as an optical apparatus according to this embodiment of the invention and FIG. 2 is a perspective view of a lens barrel mounted on the digital camera.

The digital camera according to this embodiment has a lens barrel 1, which is provided on a front side of a camera body 2 and uses a zoom method. A zoom driver 3 moves a photographing optical system from a shooting position to a retracted position along an optical axis, and the lens barrel 1 thus changes the photographing power.

Figure 3A:
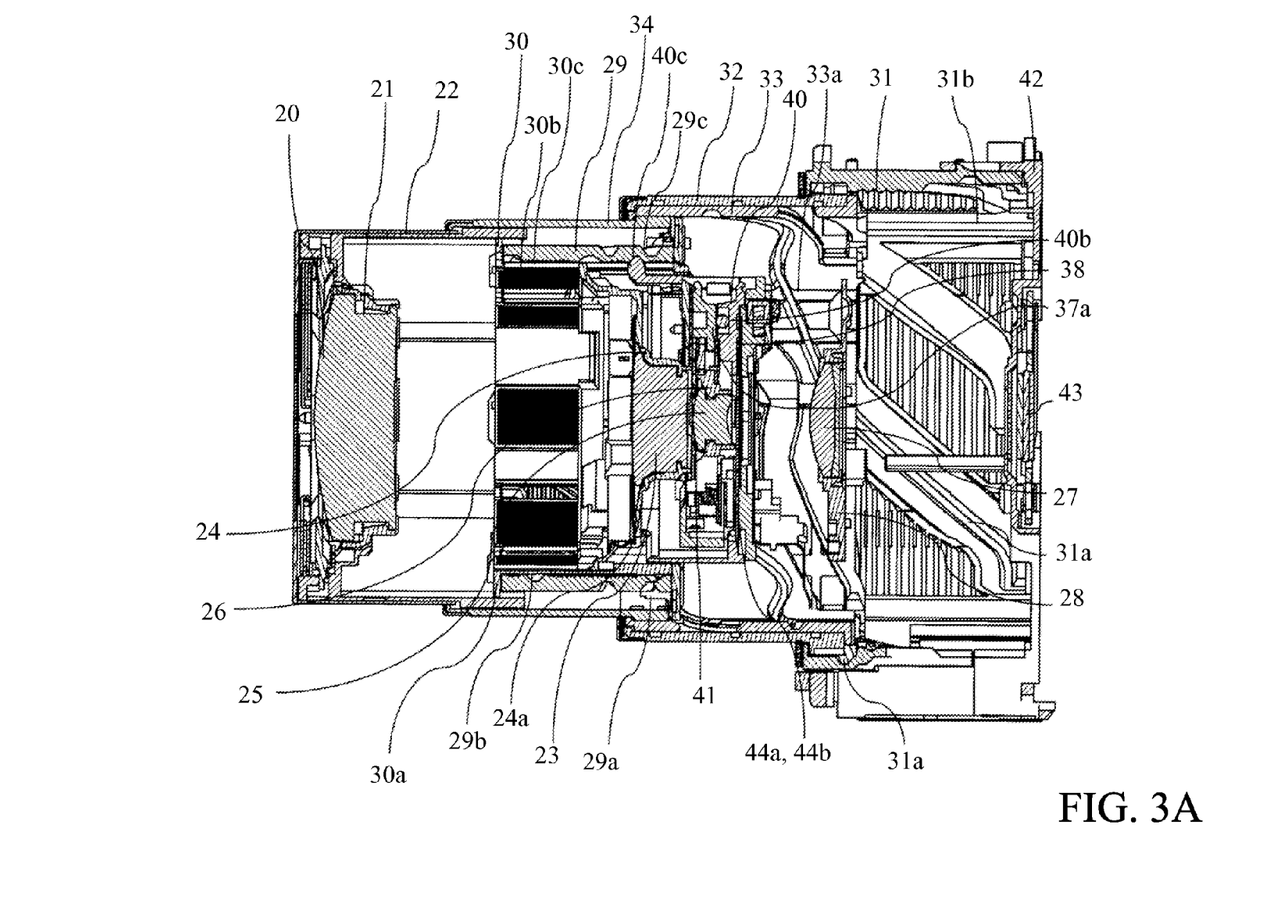
FIG. 3A is a sectional view of the lens barrel at a shooting position.
Figure 3B:
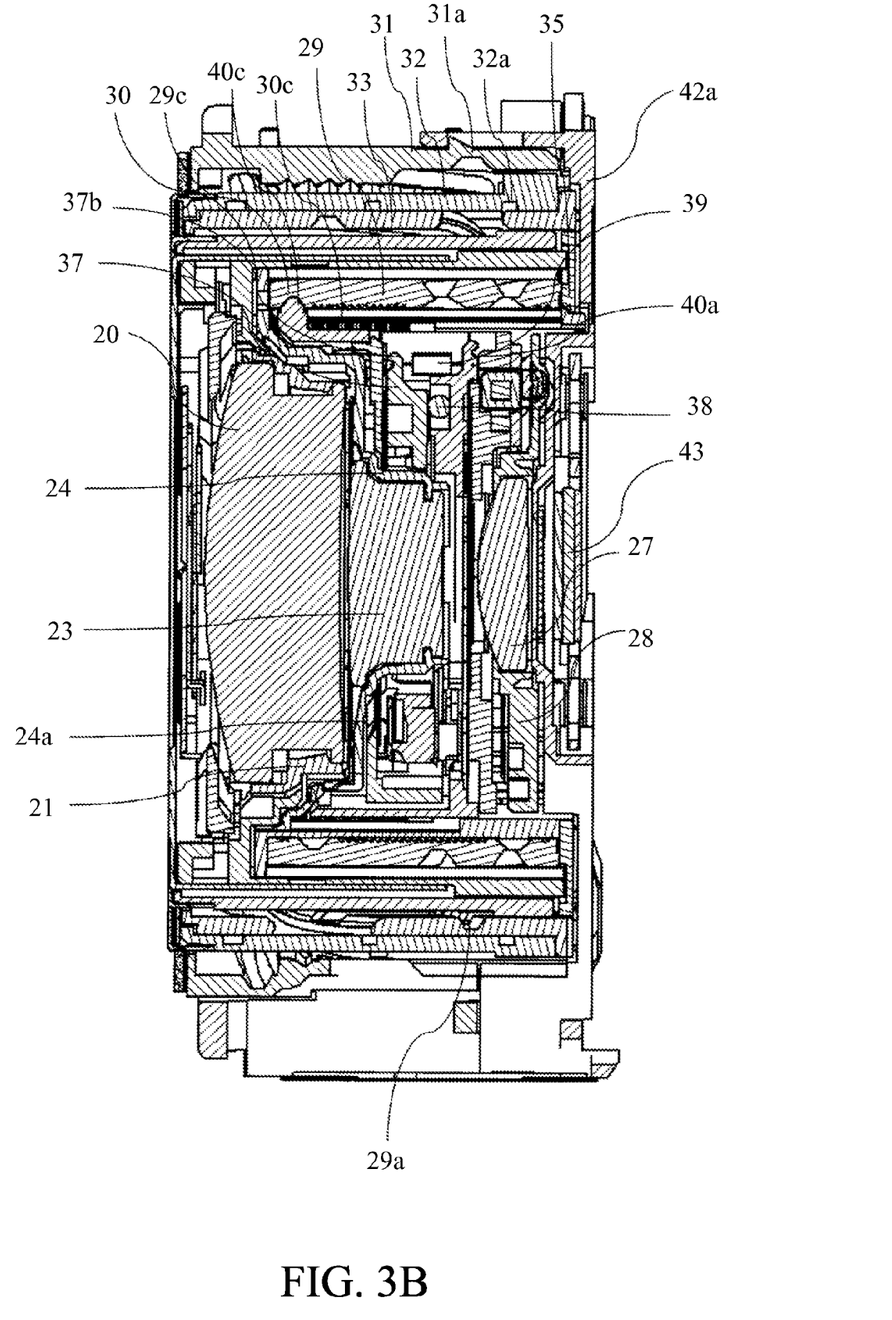
FIG. 3B is a sectional view of the lens barrel at a retracted position.

Next, the configuration of the lens barrel 1 is explained using FIGS. 3A and 3B. FIG. 3A is a sectional view of the lens barrel 1 at the shooting position, and FIG. 3B is a sectional view of the lens barrel 1 at the retracted position.

The lens barrel 1 includes a first group holder 21 holding a first group lens 20, a first group barrel 22 holding the first group holder 21, a second group holder 24 holding a second group lens 23, a third group holder 26 holding a third group lens 25, and a fourth group holder 28 holding a fourth group lens 27. The first group lens 20, the second group lens 23, the third group lens 25, and the fourth group lens 27 comprise the photographing optical system of the lens barrel 1.

An exit surface on an imaging surface of the first group lens 20 is a concave surface, a plane surface, or a convex surface which is an approximately plane surface.

A straight barrel 30 is held in an inner peripheral part of an inner cam barrel 29 so as to be relatively rotatable. On an outer peripheral part of the inner cam barrel 29, three followers, three inner cam cover engagement parts and three drive keys are arranged at substantially equal intervals in a circumferential direction.

On an inner peripheral part of a fixing barrel 31, three cam grooves 31a are formed at substantially equal interval in a circumferential direction. Three followers, which are provided at substantially equal interval in a circumferential direction on an outer peripheral part of an outer cam barrel 32, engage with the three cam grooves 31a, respectively. When the zoom driver 3 rotatably drives the outer cam barrel 32, the outer cam barrel 32 rotates relative to the fixing barrel 31 so as to move along the cam grooves 31a in an optical axis direction.

Nine bayonet claws engaging with a circumference groove 32a formed on an inner peripheral part of the outer cam barrel 32 is provided along both a circumferential direction of an outer peripheral part of an outer straight barrel 33 and the optical axis direction. Additionally, a straight key engaging with a straight key groove 31b of the fixing barrel 31 is provided on an outer peripheral part of the outer straight barrel 33. The outer straight barrel 33 rotates relative to the outer cam barrel 32 so as to move along the straight key groove 31b in the optical axis direction.

An inner cam cover 34 includes three engagement claws engaged with the inner cam cover engagement parts of the inner cam barrel 29 and three rotation stoppers fitted to the drive keys of the inner cam barrel 29, and rotates around the optical axis along with the inner cam barrel 29 so as to move along the optical axis. The drive keys engaged with three key grooves formed on the inner peripheral part of the outer cam barrel 32 and thus the inner cam barrel 29 rotates around the optical axis in the same phase with the outer cam barrel 32.

A straight plate 35 is integrally attached to the straight barrel 30. The straight plate 35 includes a straight key and the straight key engages with a straight key groove 33a formed on an inner peripheral part of the outer straight barrel 33. Additionally, a first group guide key 30a, a second group guide groove 30b, and a third guide groove 30c are formed on the straight barrel 30. The straight barrel 30 holds the inner cam barrel 29 rotatably around the optical axis by a flange and the straight plate 35, and moves along with the inner cam barrel 29 in the optical axis direction.

On an inner peripheral part of the first group barrel 22, six first group followers 22a are provided at substantially equal interval in a circumference direction. Six first group followers 22a engage with six first cam grooves 29a formed on the outer peripheral part of the inner cam barrel 29, and a guide of the first group guide key 30a of the straight barrel 30 moves the first group holder 21 and the first group barrel 22 along the optical axis.

On an outer peripheral part of the second group holder 24, three second group followers are provided at substantially equal interval in a circumference direction. Three second group followers engage with three second cam grooves 29b formed on the inner peripheral part of the inner cam barrel 29 and is guided by the second group guide groove 30b of the straight barrel 30. The second group followers thus support the second group holder 24 movably along the optical axis. Additionally, a block out flange 24a is provided between the second holder 24 and the second lens 23. The block out flange 24a blocks out a light directed from an object side to the imaging surface side along the optical axis after passing between an outer periphery of the second lens 23 and an inner periphery of the straight barrel 30.

A shutter unit is attached to a third group base plate 40. A pair of shutter blades 44a, 44b and a shutter driving apparatus are attached to the shutter unit. The shutter unit rotatably supports the shutter blades 44a, 44b. The shutter blades 44a, 44b moves between a position blocked out an optical path and a position evacuated from the optical path on a surface perpendicular to the optical axis by the shutter driving apparatus, and operates as the light quantity adjustment apparatus.

The third holder 26 holds the third group lens 25 and a bearing of a third group frame 37 supports the third holder 26 rotatably between the shooting position and an evacuated position through a holder shaft, which is pressed in a sleeve and is parallel to the optical axis. The third holder 26 thus moves on the surface perpendicular to the optical axis along with a third group frame 37 when stabilizing image blur.

A third group frame 37 includes three ball receivers 37a respectively abutting against three balls 38 and three spring hooks 37b respectively hooking first ends of three thrust springs 39. Additionally, the third group frame 37 includes a pair of magnets arranged by separating 90 degrees each other in a circumference direction on the surface perpendicular to the optical axis and an abutting surface abutting against a stopper of the third group holder 26. Moreover, a third group base plate pin movable space is formed in the third group frame 37 so as not to interfere with the third group frame 37 even if a third group base plate pin (not illustrated) moves in a direction perpendicular to the optical axis when shooting. Further, the third group frame 37 includes an optical axis direction position restricting wall abutting against the third group base pin when the third group frame 37 moves in a direction to apart from a third group base plate 40 to the optical axis direction if impact is applied.

The third group base plate 40 includes three spring hooks 40a respectively hooking second end of the three thrust springs 39. The balls 38 is sandwiched between the ball receivers 37a of the third group frame 37 and ball halls 40b of the third group base palate 40 so as to rotate in the surface perpendicular to the optical axis by urging power of the thrust springs 39. Additionally, the third group base plate 40 includes a pair of coils arranged in the same phase with the pair of magnets, a bearing pivotally supporting a third lever shaft parallel to the optical axis, and a shooting position abutting face of a third lever. The third group frame 37 is movably supported relative to the third group base plate 40 so that a mechanical end of the third group frame 37 abuts against a mechanical end of the third group base plate 40 on the surface perpendicular to the optical axis by Lorentz force generated between the pair of coils and the pair of magnets by energizing the pair of coils.

A third group mask 41 is integrally attached on an object side of the third group holder 26. A pair of Hall elements is mounted on a third group flexible substrate. The pair of Hall elements is faced to the magnets in the optical axis direction and is held by a Hall sensor holder. The Hall sensor holder is fixed to the third group base plate 40. The Hall elements detect a direction of magnetic force of the magnets or a change of power thereof. Based on this detection result, a controller of the camera body 2 acquires a position of the three group frame 37 relative to the Hall sensor holder.

The controller controls a voltage applied to the coils based on image blur information of a gyro sensor provided on the camera body 2 so as to move the third group frame 37 on the surface perpendicular to the optical axis. Then, the third group holder 26 holding the third group lens 25 is moved so as to stabilize image blur. As a result, image blur stabilization, which stabilizes image blur of the object image imaged on an image pickup element through the image pickup optical system relative to vibration such as hand shake, is performed.

On an outer peripheral part of the third group holder 40, three followers 40c are provided at substantially equal interval in a circumference direction. Three followers 40c engage with three second cam grooves 29c formed on the inner peripheral part of the inner cam barrel 29 and is guided by the third guide groove 30c of the straight barrel 30. The third group base plate 40 is thus supported movably along the optical axis relatively to the inner cam barrel 29 and the straight barrel 30.

When the third group holder 26 moves to the evacuated position out of the optical axis, the second group holder 24 holding the second group lens 23 is housed in a space where the third group holder 26 in the third group frame 37 is positioned at the shooting position. Therefore, as illustrated in FIG. 3B, thickness of the lens barrel 1 at the retracted position can be reduced.

A sensor holder 42 supports the fixing barrel 31, an image pickup element 43, the zoom driver 3 and a focus driver, and is attached to the camera body 2. The focus driver performs focusing operation by moving the fourth group holder 28 holding the fourth group lens 27 along the optical axis.

Accordingly, the lens barrel 1 extends and retracts according to driving of the zoom driver 3, and is capable of transferring to an arbitrary shooting state.

Figure 4A:
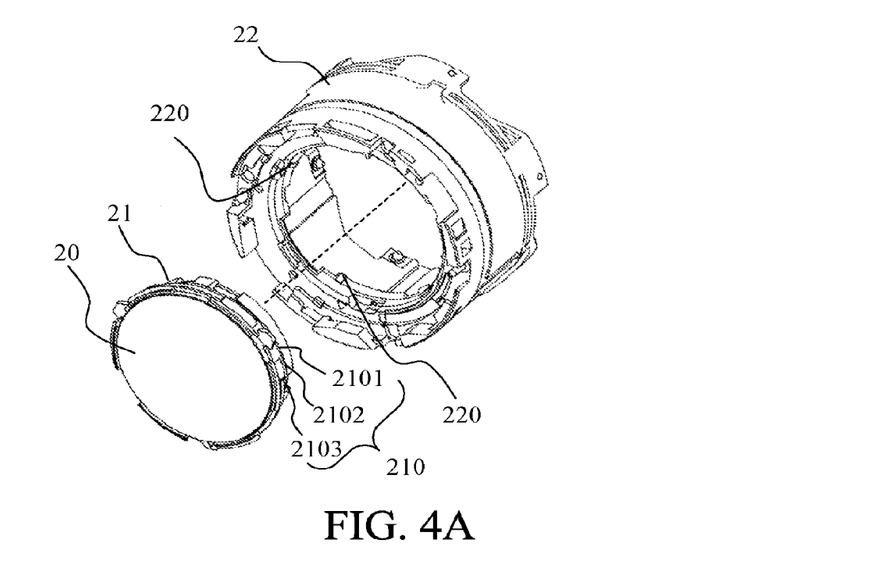
FIGS. 4A and 4B are exploded perspective view of a first group barrel and a first group holder.
Figure 4B:
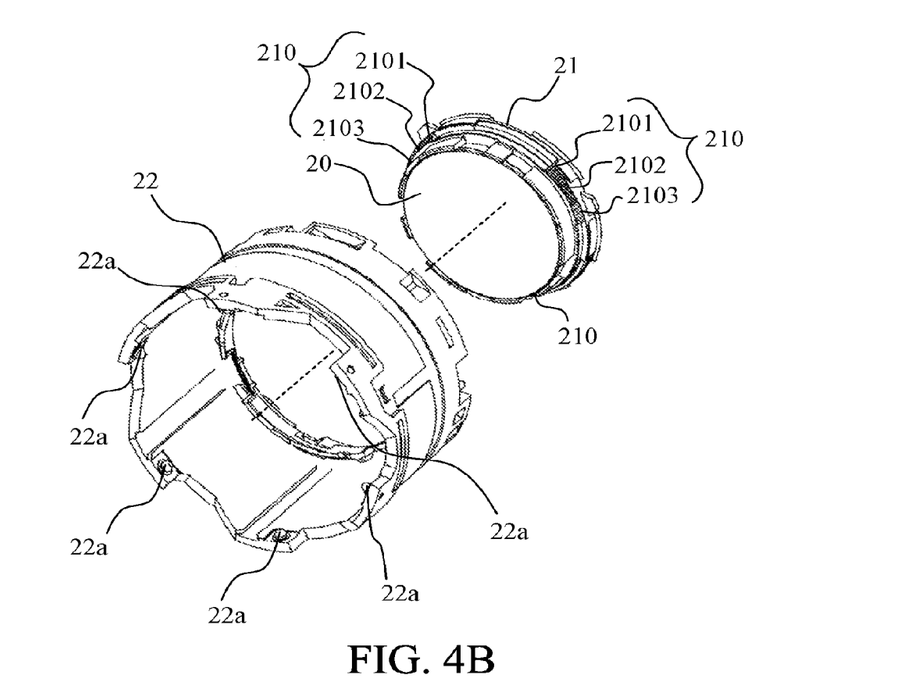

Next, tracking adjustment mechanism is described using FIGS. 4A and 4B. FIGS. 4A and 4B are exploded perspective view of the first group lens 20, the first group holder 21, and the first group barrel 22. FIG. 4A is seen from the object side, and FIG. 4B is seen from the imaging surface side. The tracking adjustment of the invention means moving a part of lenses along the optical axis so as to adjust a position thereof in the optical axis direction relative to the other lenses.

The first group holder 21 includes a plurality of adjustment face groups (adjustment member) 210. Each adjustment face group is arranged along a radial direction and has a plurality of adjustment faces 2101, 2102, 2103 whose positions in the optical axis direction differ. Three abutting portions 220 are provided in the same plane on the inner peripheral part of the first group barrel 22. The abutting portions 220 respectively abut against the adjustment faces of the first group holder 21 so as to support the first group holder 21.

In this embodiment, since three adjustment faces are formed, a three steps tracking adjustment can be performed. Then, the adjustment face groups 210 are arranged for every 3/360 degrees, in other words 120 degrees, around the optical axis. But arrangement interval is not limited to 120 degrees, and the adjustment face groups are arranged for every "the number of adjustment faces"/360 degrees according to the number of adjustment faces.

In this embodiment, the first group holder 21 includes the adjustment face groups 210, and the first group barrel 22 includes the abutting parts. The first group barrel 22 may include the adjustment face groups 210, and the first group holder 21 may include the abutting portions 220. In other words, one holder of the first group holder 21 and the first group barrel 22 may include the adjustment face groups, and the other may include the abutting portions.

Figure 5:
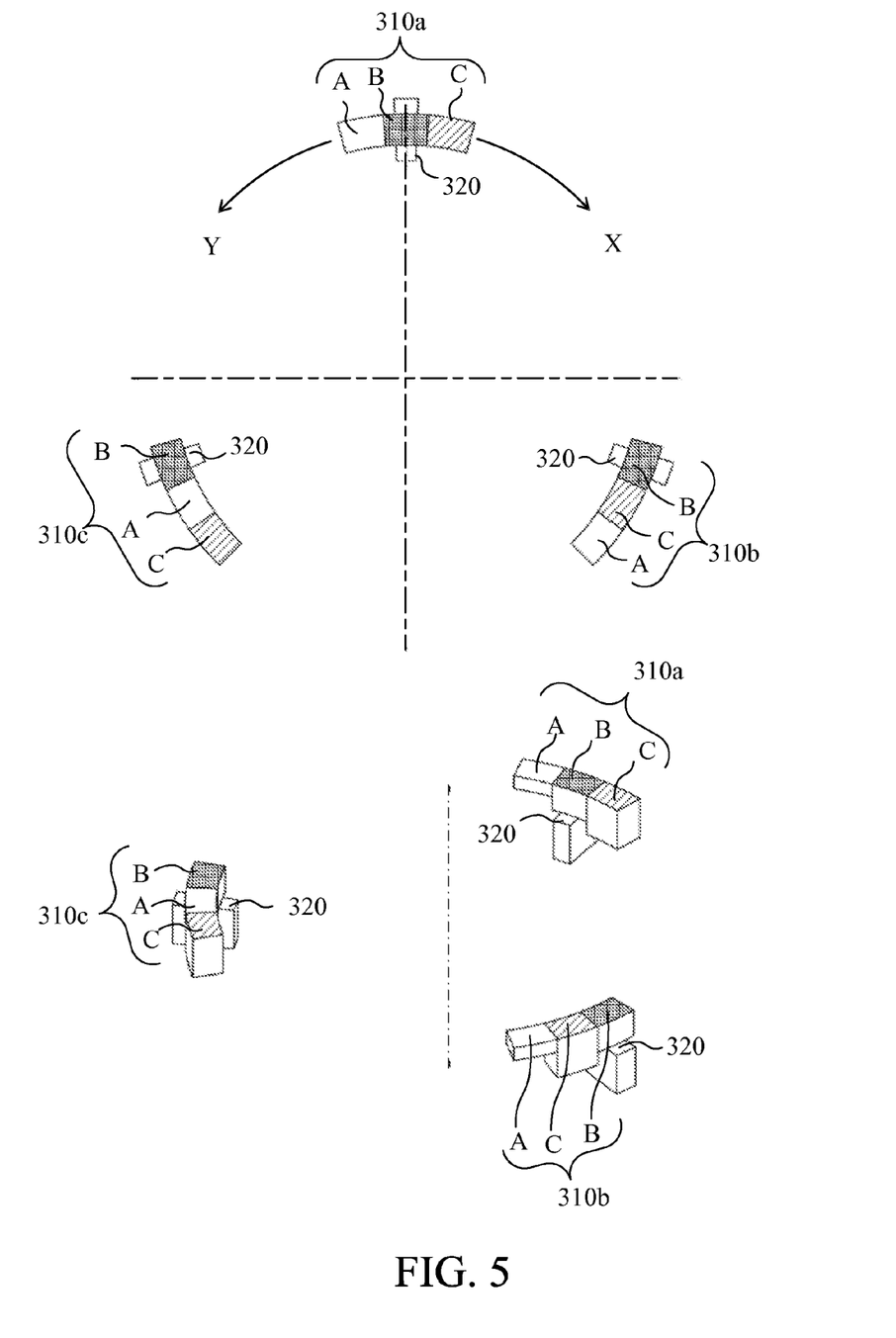
FIG. 5 is an explanatory view about an arrangement of adjustment faces.
Figures 6A, 6B:
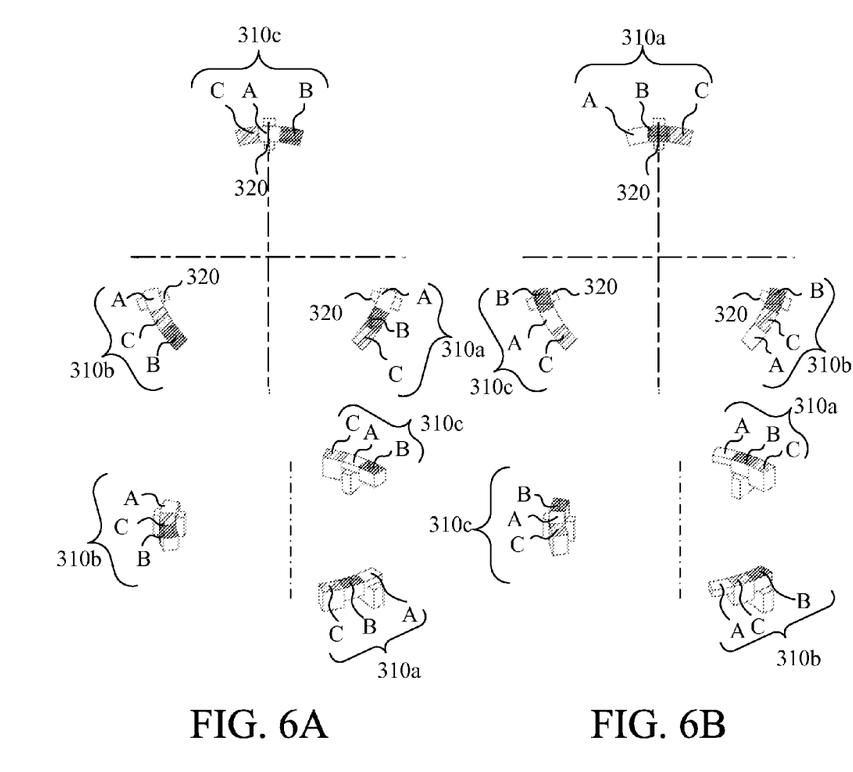
FIGS. 6A-6C are pattern diagrams of tracking adjustment.
Figure 6C:
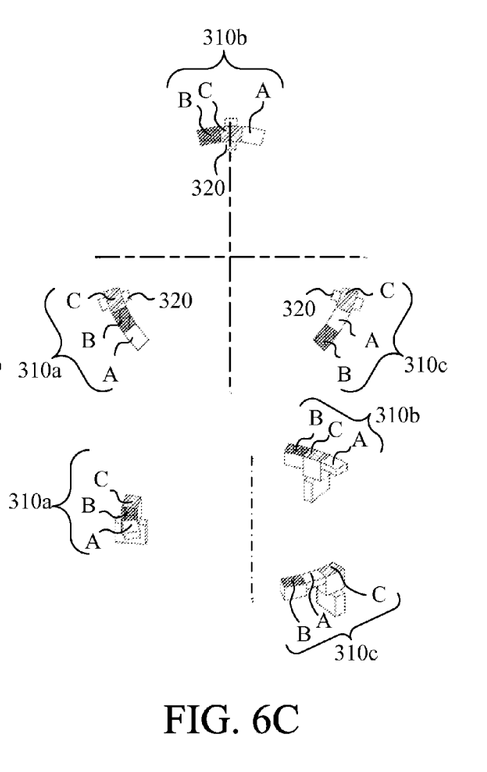

Next, the tracking adjustment in this embodiment is described using FIG. 5, FIGS. 6A-6C. FIG. 5 is an explanatory view about an arrangement of the adjustment faces. FIGS. 6A-6C are pattern diagrams of the tracking adjustment.

Adjustment faces A, B, C comprising the adjustment face groups 310 are arranged in a row along the radial direction in no particular order, and each position in the optical axis direction thereof is different. The abutting portions 320 are arranged so as to abut against any adjustment faces A, B, C. The abutting portions 320 are not arranged for every 120 degrees around the optical axis. When abutment between the adjustment face groups 310 and the abutting portions 320 is released, the adjustment face groups 310 can rotate in a first rotation direction X and a second rotation direction Y opposed to the first rotation direction X.

Then, adjustment faces A-C of an adjustment face groups 310a are arranged in order of A, B, C along the first rotation direction X. Adjustment faces A-C of an adjustment face groups 310b are arranged in order of B, C, A along the first rotation direction X. Adjustment faces A-C of an adjustment face groups 310c is arranged in order of C, A, B along the first rotation direction X. In other words, the adjustment faces A-C are regularly arranged in order of A, B, C by rotating. In this embodiment, arrangement pattern is in order of A, B, C, but an order is not considered if there is regularity in each adjustment face group, such as A, C, B or C, B, A.

According to the above arrangement, an adjustment face A is located on the second rotation direction Y side in of the adjustment face group 310a, and is located on the first rotation direction X side in the adjustment face group 310b. An adjustment face B is located on the second rotation direction Y side in the adjustment face group 310b, and is located on the first rotation direction X side in the adjustment face group 310c. An adjustment face C is located on the second rotation direction Y side in the adjustment face group 310c, and is located on the first rotation direction X side in the adjustment face group 310a. In other words, an adjustment face arranged in the most second rotation direction Y side in a first amendment face group is located at the most first rotation direction X side in a second adjustment face group which is arranged on the first rotation direction X side of the first adjustment face group.

FIGS. 6A-6C are relationship diagram between the abutting portions 320 and each adjustment faces A-C when each adjustment face group rotates by 120 degrees. The state illustrated in FIG. 6B corresponds to the state of FIG. 5. As illustrated FIGS. 6A-6C, the tracking adjustment in this embodiment can be performed by just rotating the adjustment face groups by 120 degrees.

An adjustment face located on a first rotation direction X side in the first adjustment face group may be located on a second rotation direction Y side in the second adjustment face group which is arranged on the first rotation direction X side of the first adjustment face group. Each abutting portion is arranged so as to abut against an adjustment face in each adjustment face group whose position on the optical axis is the same as a position of each abutting portion on the optical axis.

Additionally, in this embodiment, the first rotation direction X is a clockwise direction in figures, but may be a counterclockwise direction in figures.

Figure 7A:
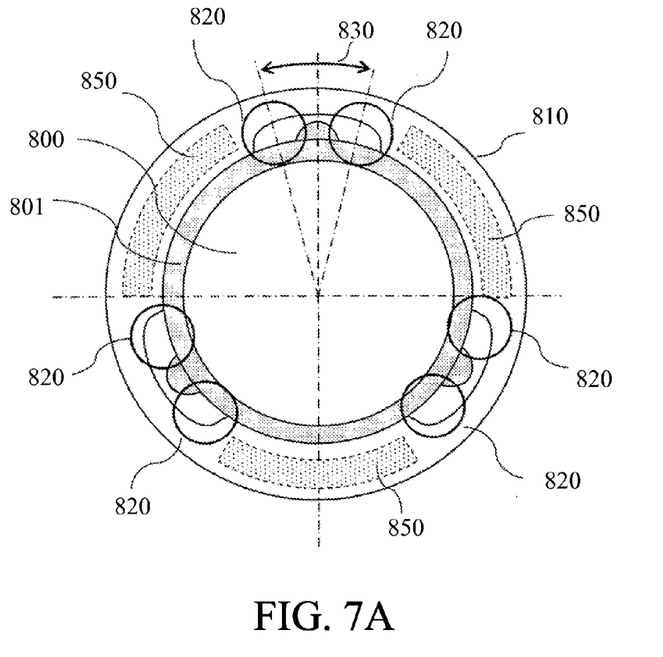
FIGS. 7A and 7B are explanatory views of clearance for tracking adjustment.
Figure 7B:
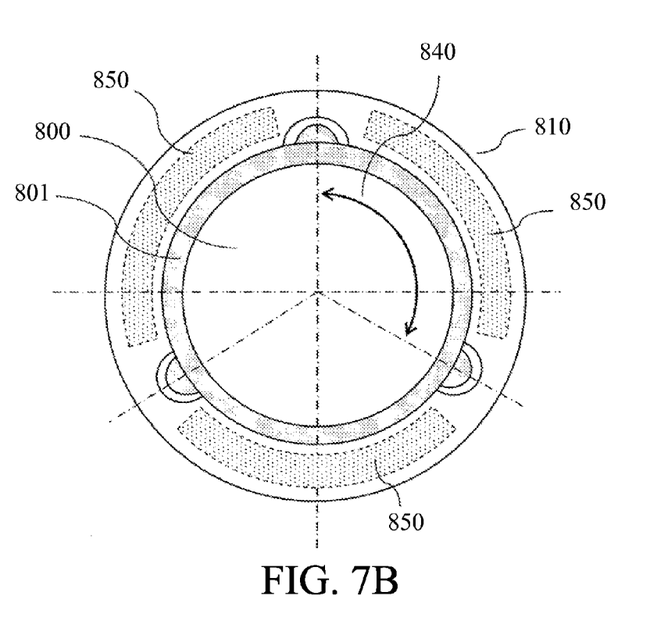

FIGS. 7A and 7B are explanatory views of clearance for tracking adjustment. FIG. 7A illustrates a comparative example, and FIG. 7B illustrates this embodiment.

In the comparative example, a first group holder 801 holding a first group lens 800 rotates (830) by adjustment steps relative to a first group lens barrel 810 so as to perform tracking adjustment. The first group lens barrel 810 needs a clearance for rotation adjustment 820 due to tracking adjustment.

Meanwhile, in this embodiment, since arrangement of the adjustment faces are the above arrangement, a position on the optical axis can be adjusted if the first group holder 801 is released from the first group lens barrel 810 and rotates (840) by 120 degrees so as to recombine. Therefore, the clearance for rotation adjustment 820 necessary previous tracking adjustment becomes unnecessary.

Therefore, in this embodiment, tracking adjustment of lenses can be easily performed, and since the clearance for rotation adjustment 820 becomes unnecessary, other space 850 spreads and excellent space efficiency can be achieved.

Figure 8:
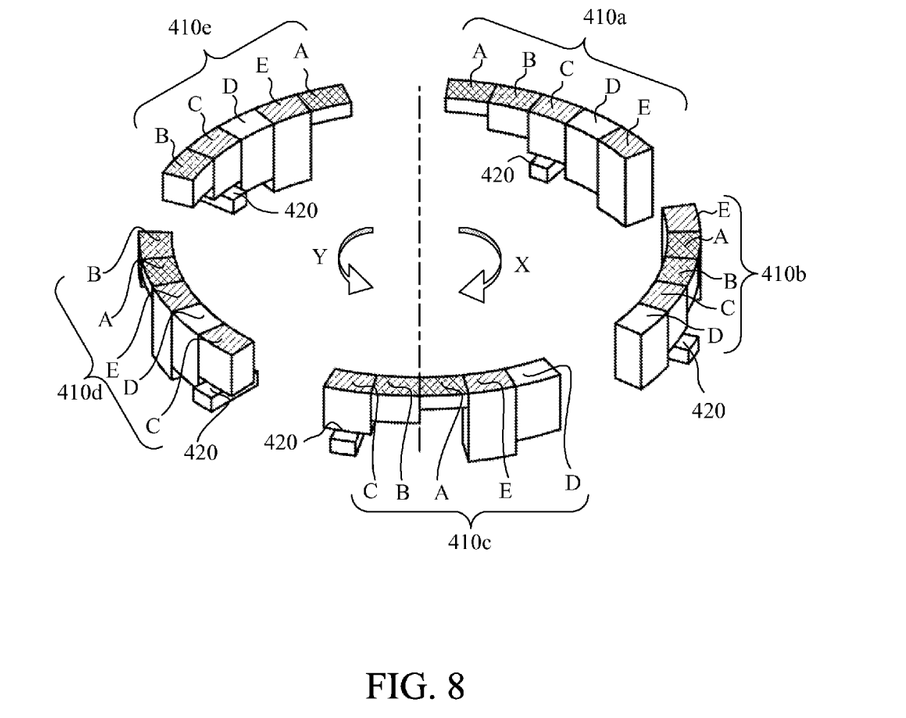
FIG. 8 is a conceptual diagram when the number of adjustment steps is five.

FIG. 8 is a conceptual diagram when the number of adjustment steps is five.

Adjustment faces A-E of each adjustment face group 410a-410e regularly are arranged. Abutting portions 420 are arranged so as to abut against any adjustment faces A-E.

As illustrated in FIG. 8, an adjustment face located on the most first rotation direction X side in a first adjustment face group is located on the most second rotation direction Y side in a second adjustment face group which is arranged on the first rotation direction X side of the first adjustment face group.

Having the above configuration, the number of adjusting steps may be any, and additionally a position on the optical axis is not considered if each adjustment face is regularly arranged.

Having the same configuration regarding the other adjustment face groups, the invention is capable of solving the previous problem, easily performing tracking adjustment of lenses, miniaturizing adjustment space and having excellent space efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-260114, filed on Dec. 17, 2013, which is hereby incorporated by reference herein in its entirety.

What is claimed is:

1. An optical apparatus including an optical system having a plurality of lenses and configured to be able to adjust a part of lenses along an optical axis, the optical apparatus comprising:
a first holder configured to hold the part of lenses; and
a second holder configured to hold the first holder,
wherein one holder of the first and second holders has a first adjustment face group and a second adjustment face group,
wherein the one holder is rotatable relative to the other holder different from the one holder,
wherein the first adjustment face group includes a plurality of first adjustment faces of which each position on the optical axis is different,
wherein the second adjustment face group includes a plurality of second adjustment faces of which each position on the optical axis is different,
wherein the second adjustment face group is provided along a first rotation direction from the first adjustment face group,
wherein the other holder has a first abutting portion which abuts against any one of the plurality of first adjustment faces and a second abutting portion which abuts against any one of the plurality of second adjustment faces, and
wherein a position on the optical axis of an adjustment face arranged at an end in a second rotation direction opposite to the first rotation direction among the plurality of first adjustment faces is approximately equal to a position on the optical axis of an adjustment face arranged at an end in the first rotation direction among the plurality of second adjustment faces.

2. The optical apparatus according to claim 1, wherein a position on the optical axis of an adjustment face arranged at an end in the first rotation direction among the plurality of first adjustment faces is approximately equal to a position on the optical axis of an adjustment face not arranged at both ends in the first and second rotation directions among the plurality of second adjustment faces.

3. The optical apparatus according to claim 1, wherein a position on the optical axis of an adjustment face among the plurality of first adjustment faces, which abuts against the first abutting portion, is approximately equal to a position on the optical axis of an adjustment face among the plurality of second adjustment faces, which abuts against the second abutting portion.

4. An optical apparatus including an optical system having a plurality of lenses and configured to be able to adjust a part of lenses along an optical axis, the optical apparatus comprising:
a first holder configured to hold the part of lenses; and
a second holder configured to hold the first holder,
wherein one holder of the first and second holders has a first adjustment face group, a second adjustment face group and a third adjustment face group,
wherein the one holder is rotatable relative to the other holder different from the one holder,
wherein the first adjustment face group includes a plurality of first adjustment faces of which each position on the optical axis is different,
wherein the second adjustment face group includes a plurality of second adjustment faces of which each position on the optical axis is different,
wherein the third adjustment face group includes a plurality of third adjustment faces of which each position on the optical axis is different, wherein the second adjustment face group is provided along a first rotation direction from the first adjustment face group, wherein the third adjustment face group is provided along the first rotation direction from the second adjustment face group, wherein the first adjustment face group is provided along the first rotation direction from the third adjustment face group, wherein the other holder has a first abutting portion which abuts against any one of the plurality of first adjustment faces, a second abutting portion which abuts against any one of the plurality of second adjustment faces and a third abutting portion which abuts against any one of the plurality of third adjustment faces, and wherein a position on the optical axis of an adjustment face arranged at an end in a second rotation direction opposite to the first rotation direction among the plurality of first adjustment faces is approximately equal to a position on the optical axis of an adjustment face arranged at an end in the first rotation direction among the plurality of second adjustment faces and a position on the optical axis of an adjustment face not arranged at both ends in the first and second rotation directions among the plurality of third adjustment faces.

5. The optical apparatus according to claim 4, wherein a position on the optical axis of an adjustment face arranged at an end in the first rotation direction among the plurality of first adjustment faces is approximately equal to a position on the optical axis of an adjustment face not arranged at both ends in the first and second rotation directions among the plurality of second adjustment faces and a position on the optical axis of an adjustment face arranged at an end in the second rotation direction among the plurality of third adjustment faces.

6. The optical apparatus according to claim 4, wherein a position on the optical axis of an adjustment face among the plurality of first adjustment faces, which abuts against the first abutting portion, is approximately equal to a position on the optical axis of an adjustment face among the plurality of second adjustment faces, which abuts against the second abutting portion and a position on the optical axis of an adjustment face among the plurality of third adjustment faces, which abuts against the third abutting portion.

* * * * *